United States Patent
Kerber et al.

(10) Patent No.: US 9,530,860 B2
(45) Date of Patent: Dec. 27, 2016

(54) III-V MOSFETS WITH HALO-DOPED BOTTOM BARRIER LAYER

(71) Applicant: GLOBALFOUNDRIES INC., Grand Cayman (KY)

(72) Inventors: Pranita Kerber, Mount Kisco, NY (US); Chung-Hsun Lin, White Plains, NY (US); Amlan Majumdar, White Plains, NY (US); Jeffrey W. Sleight, Ridgefield, CT (US)

(73) Assignee: Globalfoundries, Inc., Grand Cayman (KY)

( * ) Notice: Subject to any disclaimer, the term of this patent is extended or adjusted under 35 U.S.C. 154(b) by 0 days.

(21) Appl. No.: 14/578,768

(22) Filed: Dec. 22, 2014

(65) Prior Publication Data
US 2016/0181394 A1    Jun. 23, 2016

(51) Int. Cl.
*H01L 29/78* (2006.01)
*H01L 29/66* (2006.01)

(52) U.S. Cl.
CPC ... *H01L 29/66522* (2013.01); *H01L 29/66492* (2013.01); *H01L 29/66537* (2013.01); *H01L 29/66575* (2013.01); *H01L 29/78* (2013.01)

(58) Field of Classification Search
CPC ............ H01L 29/205; H01L 29/66446; H01L 29/66522; H01L 29/20; H01L 29/66492; H01L 29/66537; H01L 21/823412
See application file for complete search history.

(56) References Cited

U.S. PATENT DOCUMENTS

| | | |
|---|---|---|
| 6,268,640 B1 | 7/2001 | Park et al. |
| 6,437,406 B1 | 8/2002 | Lee |
| 6,924,215 B2 | 8/2005 | Huang et al. |
| 7,595,247 B2 | 9/2009 | Dokumaci et al. |
| 7,601,569 B2 | 10/2009 | Cai et al. |
| 8,115,235 B2 | 2/2012 | Pillarisetty et al. |
| 8,148,218 B2 | 4/2012 | Chang |
| 8,426,927 B2 | 4/2013 | Curello et al. |
| 8,669,146 B2 | 3/2014 | Abou-Khalil et al. |

(Continued)

OTHER PUBLICATIONS

Y.Q.Wu et al., "High Performance Deep-Submicron Inversion-Mode InGaAs MOSFETs with maximum Gm exceeding 1.1 mS/μm: New HBr Pretreatment and Channel Engineering," IEEE International Electron Devices Meeting (IEDM), Dec. 7-9, 2009, pp. 13.2.1-13.2.4.

(Continued)

*Primary Examiner* — Yu Chen
(74) *Attorney, Agent, or Firm* — Anthony Canale; Hoffman Warnick LLC (57) ABSTRACT

Techniques for controlling short channel effects in III-V MOSFETs through the use of a halo-doped bottom (III-V) barrier layer are provided. In one aspect, a method of forming a MOSFET device is provided. The method includes the steps of: forming a III-V barrier layer on a substrate; forming a III-V channel layer on a side of the III-V barrier layer opposite the substrate, wherein the III-V barrier layer is configured to confine charge carriers in the MOSFET device to the III-V channel layer; forming a gate stack on a side of the III-V channel layer opposite the III-V barrier layer; and forming halo implants in the III-V barrier layer on opposite sides of the gate stack. A MOSFET device is also provided.

7 Claims, 4 Drawing Sheets

(56) References Cited

U.S. PATENT DOCUMENTS

2008/0308867 A1* 12/2008 Cai ..................... H01L 29/458
                                                                  257/348
2010/0148153 A1    6/2010 Hudait et al.
2011/0147712 A1*  6/2011 Radosavljevic .. H01L 29/66462
                                                                   257/24

OTHER PUBLICATIONS

Vurgaftman et al., "Band parameters for III-V compound semiconductors and their alloys," Journal of Applied Physics, vol. 89, No. 11 (Jun. 2001).
Smith et al., "High rate and selective etching of GaN, AlGaN, and AlN using an inductively coupled plasma," Appl. Phys. Lett. 71 (25) (Dec. 1997).
Cooper et al., "Use of thin AlGaAs and InGaAs stop-etch layers for reactive ion etch processing of III-V compound semiconductor devices," Appl. Phys. Lett. 51, 26 (Dec. 1987).

* cited by examiner

III-V MOSFETS WITH HALO-DOPED BOTTOM BARRIER LAYER

FIELD OF THE INVENTION

The present invention relates to controlling short channel effects in metal-oxide semiconductor field effect transistors (MOSFETs) and more particularly, to III-V MOSFETs having a halo-doped bottom barrier layer.

BACKGROUND OF THE INVENTION

In field effect transistor (FET) devices, short-channel effects occur when the channel length is on the same order of magnitude as the depletion layer widths of the source and drain junctions. Short channel effects often arise when channel lengths are scaled.

In conventional partially depleted silicon-on-insulator (PDSOI) MOSFETs, short-channel effects are typically controlled by halo doping in the channel. However, halo doping the channel can undesirably lead to (i) mobility degradation due to Coulomb scattering at low fields, and (ii) external resistance $R_{EXT}$ degradation due to partial compensation of extensions by halo. The same is true for III-V MOSFETs.

Thus, improved techniques for controlling short channel effects in III-V MOSFETs would be desirable.

SUMMARY OF THE INVENTION

The present invention provides techniques for controlling short channel effects in III-V metal-oxide semiconductor field effect transistors (MOSFETs) through the use of a halo-doped bottom (III-V) barrier layer. In one aspect of the invention, a method of forming a MOSFET device is provided. The method includes the steps of: forming a III-V barrier layer on a substrate; forming a III-V channel layer on a side of the III-V barrier layer opposite the substrate, wherein the III-V barrier layer is configured to confine charge carriers in the MOSFET device to the III-V channel layer; forming a gate stack on a side of the III-V channel layer opposite the III-V barrier layer; and forming halo implants in the III-V barrier layer on opposite sides of the gate stack.

In another aspect of the invention, a MOSFET device is provided. The MOSFET device includes: a substrate; a III-V barrier layer on the substrate; a III-V channel layer on a side of the III-V barrier layer opposite the substrate, wherein the III-V barrier layer is configured to confine charge carriers in the MOSFET device to the III-V channel layer; a gate stack on a side of the III-V channel layer opposite the III-V barrier layer; and halo implants in the III-V barrier layer on opposite sides of the gate stack.

A more complete understanding of the present invention, as well as further features and advantages of the present invention, will be obtained by reference to the following detailed description and drawings.

DETAILED DESCRIPTION OF PREFERRED EMBODIMENTS

Provided herein are techniques for controlling short channel effects in III-V metal-oxide semiconductor field effect transistors (MOSFETs) through the use of a halo-doped bottom (III-V) barrier layer. Specifically, unlike partially depleted silicon-on-insulator (PDSOI) MOSFETs with an insulating buried oxide (BOX), the present III-V MOSFETs have a semiconductor bottom barrier layer which acts like a BOX (because the bottom barrier layer has a smaller electron affinity than the channel and therefore there is a large conduction band offset between the channel and the bottom barrier layer). Therefore, advantageously, it has been found in accordance with the present techniques that this "BOX" in III-V MOSFETs can be doped with halo altogether avoiding the problems associated with halo doping the channel, i.e., such as degrading (i) mobility and (ii) external resistance $R_{EXT}$—see above.

The present techniques generally involve employing both a III-V channel layer and an underlying (i.e., bottom) III-V barrier layer. The III-V material for the barrier layer will be chosen to have a smaller electron affinity than the III-V material for the channel layer. The purpose of the III-V barrier layer is to confine the charge carriers in the MOSFET to the III-V channel layer by selecting a wider band gap III-V material for the barrier layer. By way of example only, suitable III-V barrier layer/channel layer combinations can include the III-V channel layer being formed from a III-V indium gallium arsenide (InGaAs) material having the formula $In_xGa_{1-x}As$, where x=0.4, 0.3, 0.2 (varying the value of x modifies the electron affinity of the III-V channel layer). The barrier layer could be a III-V gallium arsenide material, a III-V aluminum arsenide material, or a III-V aluminum gallium arsenide (AlGaAs) material having the formula $Al_yGa_{1-y}As$. An analogous material system would be employing a III-V gallium arsenide antimonide (GaAsSb) material for the III-V channel layer (wherein the As and Sb percentage can be varied to modify the electron affinity of the III-V channel layer. In that case, the barrier layer could be a III-V gallium antimonide material, a III-V aluminum antimonide material, or a III-V gallium aluminum antimonide material. Suitable barrier layer thicknesses might be less than about 40 nanometers (nm), e.g., from about 10 nm to about 30 nm, and ranges therebetween, and suitable channel layer thicknesses might be less than about 10 nm, e.g., from about 2 nm to about 8 nm, and ranges therebetween. See below. It is notable that for the present III-V barrier and channel layer materials, electron affinity will to a large degree move with materials band gap. As provided above, a (III-V) barrier layer will preferably have a larger bandgap than a (III-V) channel layer. For a general discussion of III-V material band gap see, for example, Vurgaftman et al., "Band parameters for III-V compound semiconductors and their alloys," Journal of Applied Physics, vol. 89, no. 11 (June 2001), the contents of which are incorporated by reference as if fully set forth herein.

Halo doping (to control short channel effects) is then performed into the III-V barrier rather than into the channel layer. This technique is not possible in conventional process flows with typical BOX configurations since the BOX is electrically inert. Here the barrier layer serves as a "BOX." However, the barrier layer is a semiconductor and thus can receive halo doping.

When a layer is described herein as being a III-V layer it is intended to mean that the layer is formed from a III-V material. The term "III-V material," as used herein and throughout the following description, refers to a material that includes at least one group III element and at least one group V element. By way of example only, suitable III-V materials include, but are not limited to, one or more of aluminum gallium arsenide, aluminum gallium nitride, aluminum arsenide, aluminum indium arsenide, aluminum nitride, gallium antimonide, gallium aluminum antimonide, gallium arsenide, gallium arsenide antimonide, gallium nitride, indium antimonide, indium arsenide, indium gallium arsenide, indium gallium arsenide phosphide, indium gallium nitride, indium nitride, indium phosphide and combinations including at least one of the foregoing materials. Thus, according to an exemplary embodiment, when a layer is described herein as being a III-V layer, that layer is formed from at least one of these III-V materials.

A first exemplary embodiment of the present techniques is now described by way of reference to FIGS. 1-6. An alternative embodiment will be described below which can be used to increase the amount by which the halo implant creeps under the gate.

Figure 1:
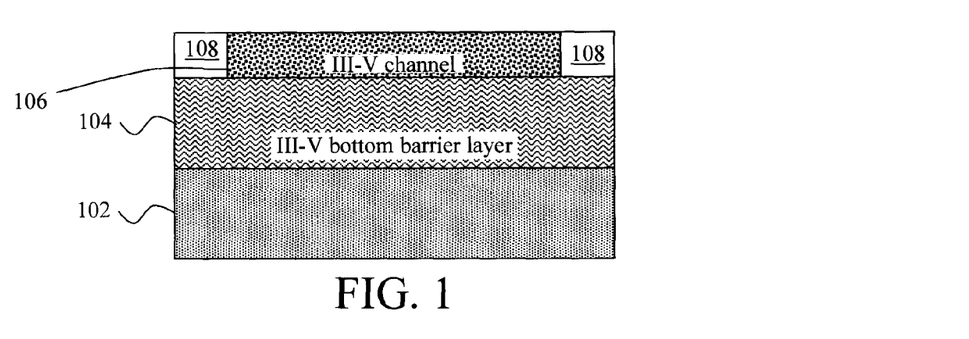
FIG. 1 is a cross-sectional diagram illustrating a starting structure for forming a III-V metal-oxide semiconductor field effect transistor (MOSFET) having a III-V barrier layer formed on a substrate, and a III-V channel layer formed on the III-V barrier layer according to an embodiment of the present invention.

As shown in FIG. 1, the process in this example begins with a substrate 102 onto which the III-V bottom barrier layer 104 is deposited. The III-V channel layer 106 is deposited onto a side of the III-V barrier layer 104 opposite the substrate 102. Substrate 102 can be any suitable substrate on which a MOSFET can be fabricated. By way of example only, substrate 102 is a bulk semiconductor (e.g., silicon (Si), germanium (Ge), silicon germanium (SiGe), etc.) wafer.

According to an exemplary embodiment, each of the III-V material layers (e.g., the III-V barrier layer, the III-V channel layer, etc.) present in the device is grown using a standard epitaxial deposition process. As provided above, one specification for the barrier layer/channel layer combination is that the III-V material selected for the III-V barrier layer 104 (e.g., from the above exemplary III-V materials) has a wider band gap than the III-V material selected for the III-V channel layer 106 (e.g., also from the above-exemplary III-V materials). This will insure that the charge carriers in the device will be confined to the channel layer. Reference may be made herein to the III-V material forming the barrier layer as being a first III-V material, and the III-V material forming the channel layer as being a second III-V material, etc. This is merely an arbitrary designation intended solely to differentiate the material in one layer from that in the other layer. Being a semiconductor, the III-V barrier layer below the channel layer can receive the halo implants rather than the channel thus preventing damage to the channel caused by the doping. See below. According to an exemplary embodiment, the barrier layer 104 is formed on the substrate 102 to a thickness of less than about 40 nm, for example, from about 10 nm to about 30 nm, and ranges therebetween; and the channel layer 106 is formed on the barrier layer 104 to a thickness of less than about 10 nm, for example, from about 2 nm to about 8 nm, and ranges therebetween.

Next one or more active areas are defined in the channel layer 106. While the figures depict a single active area it is understood that multiple devices are typically fabricated, often with concurrent processing steps, on the same wafer. According to an exemplary embodiment, the active areas are defined using a shallow trench isolation (STI) process. As is known in the art, STI involves patterning trenches in an active layer(s) (in this case the III-V channel layer 106) and then filling the trenches with an insulator such as an oxide (i.e., an STI oxide 108). See FIG. 1.

Figure 2:
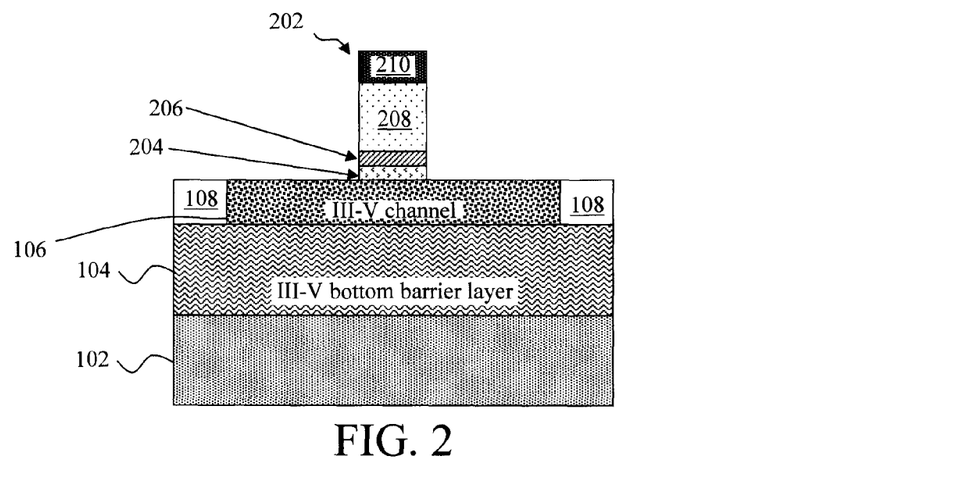
FIG. 2 is a cross-sectional diagram illustrating a gate stack having been formed on a side of the III-V channel layer opposite the III-V barrier layer according to an embodiment of the present invention.

Next, as shown in FIG. 2 a gate stack 202 is formed on a side of the III-V channel layer 106 opposite the III-V barrier layer 104. According to the exemplary embodiment shown in the figures, the gate stack 202 includes a gate dielectric 204 on the III-V channel layer 106, a metal gate layer 206 on a side of the gate dielectric 204 opposite the III-V channel layer 106, and a semiconductor gate layer 208 on a side of the metal gate layer 206 opposite the gate dielectric 204.

By way of example only, gate stack 202 can be formed by blanket depositing each of the gate layers in succession onto the III-V channel layer 106, and then patterning the gate layers to form the gate stack 202. For example, a blanket layer of the gate dielectric 204 can be deposited onto the III-V channel layer 106. A blanket layer of the metal gate layer 206 can be deposited onto a side of the gate dielectric 204 opposite the III-V channel layer 106. A blanket layer of the semiconductor gate layer 208 can then be deposited onto a side of the metal gate layer 206 opposite the gate dielectric 204.

Suitable gate dielectric materials include, but are not limited to, oxides such as $SiO_2$ (low-κ) and hafnium or lanthanum oxide (high-κ). Suitable gate metals include, but are not limited to, platinum (Pt), palladium (Pd), nickel (Ni) and/or alloys containing at least one of the foregoing metals. Suitable semiconductor gate materials include, but are not limited to, poly-silicon.

A standard gate lithography and etching process may then be employed to pattern the gate layers into the gate stack 202. By way of example only, as shown in FIG. 2, a gate hard mask 210 may be formed with the footprint and location of the gate stack 202. An anisotropic etching process such as reactive ion etching (RIE) can then be used to pattern the gate layers around the hardmask 210 to form the gate stack 202. Following the gate etch, the hardmask 210 can be removed, or optionally (as shown in the figures) left in place to protect the gates during subsequent processing steps.

Source/drain extension implants 302 are then formed in the III-V channel layer 106 on opposite sides of the gate stack 202. See FIG. 3. Standard dopant implantation processes may be employed to form the source/drain extension implants 302. According to an exemplary embodiment, the source/drain extension implants 302 are formed using a low energy implant of an n-type dopant (such as silicon (Si)) into the channel layer 106 at a small tilt angle, e.g., of less than about 10 degrees. As is known in the art, during ion implantation the tilt and twist angle of the subject wafer with respect to the ion beam can be varied to change how the beam strikes the wafer. See for example U.S. Pat. No. 6,924,215 issued to Huang et al., entitled "Method of monitoring high tilt angle of medium current implant" (hereinafter "U.S. Pat. No. 6,924,215"), the contents of which are incorporated by reference as if fully set forth herein. The tilt angle is the angle between the surface normal of the target wafer and the ion beam. See, for example, FIG. 1 of U.S. Pat. No. 6,924,215.

Figure 3:
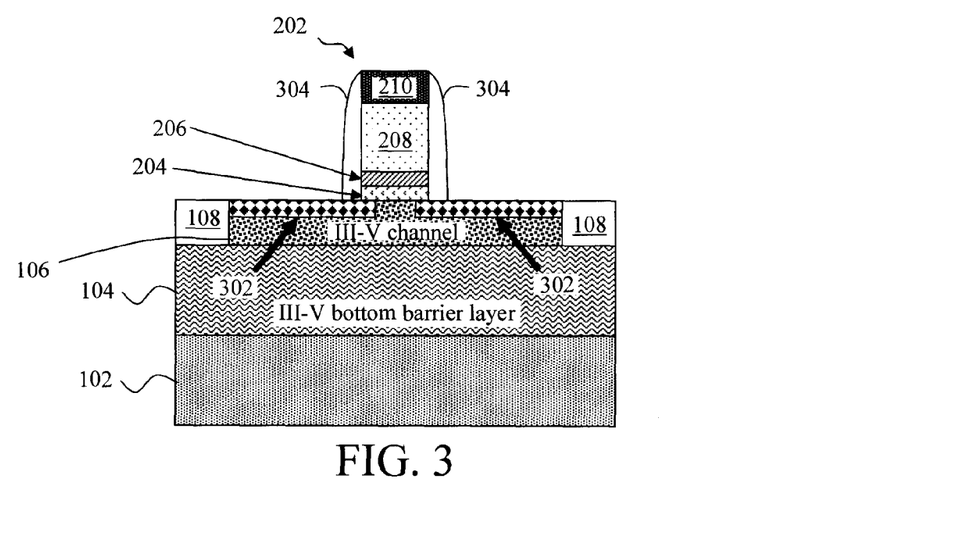
FIG. 3 is a cross-sectional diagram illustrating source/drain extension implants having been formed in the III-V channel layer on opposite sides of the gate stack, and spacers having been formed on opposite sides of the gate stack according to an embodiment of the present invention.

Spacers 304 may then be formed on opposite sides of the gate stack 202. Spacers 304 serve to offset the gate stack 202 from the source and drain regions (see below). According to an exemplary embodiment, spacers 304 are formed by first blanket depositing a spacer material onto the structure, and then using standard lithography and etching (e.g., RIE) to pattern the spacer material into the individual spacers 304. Suitable spacer materials include, but are not limited to, a nitride spacer material such as silicon nitride (SiN).

Figure 4:
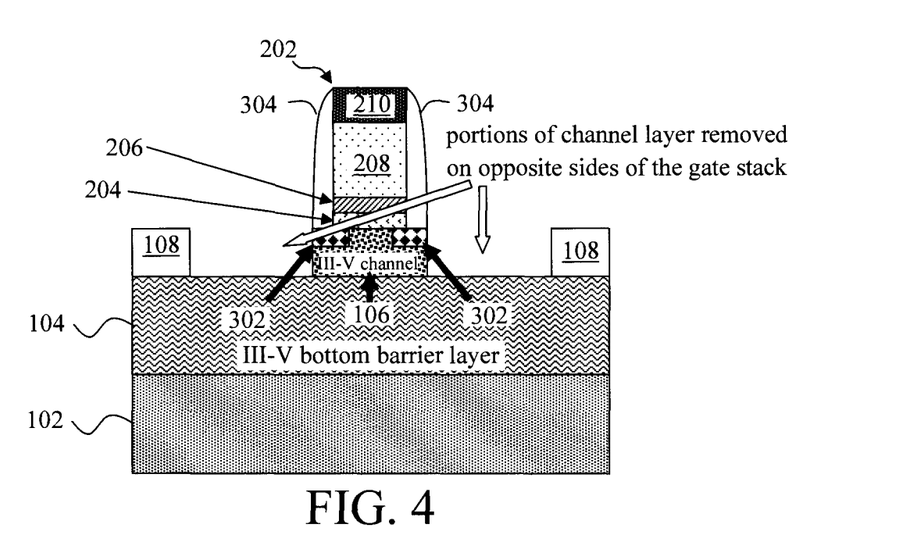
FIG. 4 is a cross-sectional diagram illustrating an etch of the III-V channel layer having been performed to remove portions of the III-V channel layer (and with it portions of the source/drain extension implants) adjacent to opposite sides of the gate stack, thereby exposing the underlying III-V barrier layer on opposite sides of the gate stack according to an embodiment of the present invention.

An anneal is typically performed to activate the implanted source/drain extension. However, in the present example, it is preferable to perform this 'activation anneal' after the halo doping of the III-V barrier layer 104 has been performed. To begin the halo doping process, an etch of the III-V channel layer 106 is first performed to remove portions of the III-V channel layer 106 (and with it portions of the source/drain extension implants 302) adjacent to opposite sides of the gate stack 202, exposing the underlying portions of the III-V barrier layer 104 on opposite sides of the gate stack 202. See FIG. 4. According to an exemplary embodiment, an anisotropic etching process (such as RIE) is used in this step to pattern the III-V channel layer 106. As shown in FIG. 4, the result is that the III-V channel layer 106 and the source/drain extension implants 302 remain only beneath the gate stack 202/spacers 304 (i.e., the gate stack 202/spacers 304 block the directional etching process).

Advantageously, the III-V barrier layer 104 acts as an etch stop during this etch of the III-V channel layer 106. Namely, by employing different III-V materials for the channel and barrier layers the RIE etch chemistry can target selectivity for the channel III-V material over the barrier III-V material. It is well within the capabilities of one skilled in the art to tailor the etch chemistry to achieve etch selectivity of one III-V material over another, through adjusting gate pressures, gas ratios, and plasma power. For instance, the selective etching method using various gas chemistries and stop layer is well known in the art. See, for example, Smith et al., "High rate and selective etching of GaN, AlGaN, and MN using an inductively coupled plasma," Appl. Phys. Lett. 71 (25) (December 1997); and Cooper et al., "Use of thin AlGaAs and InGaAs stop-etch layers for reactive ion etch processing of III-V compound semiconductor devices," Appl. Phys. Lett. 51, 26 (December 1987), the contents of both of which are incorporated by reference as if fully set forth herein.

Figure 5:
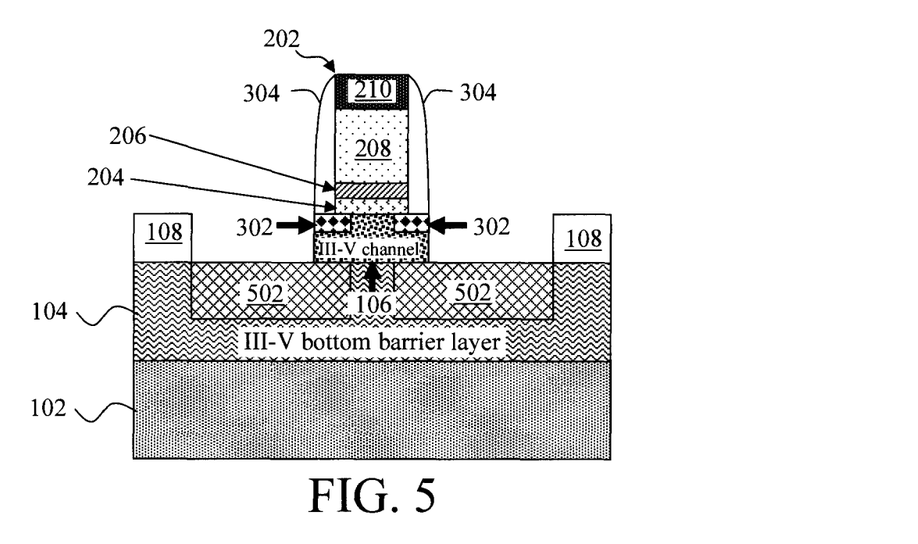
FIG. 5 is a cross-sectional diagram illustrating halo implants having been formed in the III-V barrier layer on opposite sides of the gate stack according to an embodiment of the present invention.

Halo implants 502 are then formed in the III-V barrier layer 104 on opposite sides of the gate stack 202. According to an exemplary embodiment, the halo implants 502 are formed using a lower energy implant than the source/drain extension implant above to implant a p-type dopant (such as zinc (Zn)) into the III-V barrier layer 104 at a tilt angle of about 30 degrees. By way of example only, the halo implant energy would be less than 65 kiloelectron volt (keV) for a Zn ion implantation, for example, from about 18 keV to about 42 keV, and energy ranges therebetween for Zn ion implantation. By increasing the tilt angle, one can increase the amount by which the halo implants 502 extend under the gate stack 202 which can lead to positive channel effects. In an alternative exemplary embodiment provided below, halo implantation is performed earlier in the process flow to enable the halo implants to extend even further beneath the gate 202.

Following the formation of the halo implants 502, an anneal may be performed to activate (i.e., an activation anneal) the source/drain extension and halo implants. According to an exemplary embodiment, this activation anneal is performed using a rapid thermal annealing (RTA) process at a temperature of from about 500° C. to about 600° C., and ranges therebetween, e.g., at a temperature of about 550° C.

Raised source and drain regions 602 are formed on the III-V barrier layer 104 adjacent to the III-V channel layer 106 (on opposite sides of the gate stack 202). See FIG. 6. By way of example only, the raised source and drain regions 602 can be formed using an epitaxial growth process. The parameters for a standard epitaxial process for forming raised source and drain (RSD) regions would be apparent to one skilled in the art, and thus are not described further herein. According to an exemplary embodiment, the raised source and drain regions 602 are formed from an in-situ n-doped III-V material such as gallium arsenide, indium gallium arsenide, gallium antimonide, and/or indium arsenide.

Figure 6:
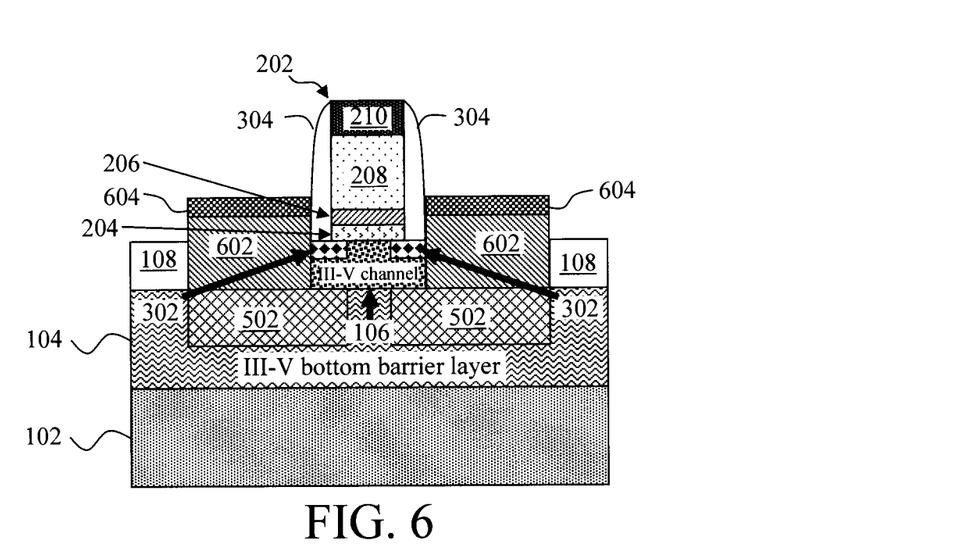
FIG. 6 is a cross-sectional diagram illustrating raised source and drain regions having been formed on the III-V barrier layer adjacent to the III-V channel layer (on opposite sides of the gate stack), and source and drain contacts having been formed to the raised source and drain regions according to an embodiment of the present invention.

Finally, as shown in FIG. 6, source and drain contacts 604 are formed on each of the raised source and drain regions 602. By way of example only, contacts 604 can be formed using a silicidation process wherein a silicide metal is deposited onto the structure. The silicide metal will only react with exposed semiconductor—making the process self-aligned, i.e., forming a salicide. In the example depicted, the hard mask 210 prevents silicidation of the gate stack 202. Suitable silicide metals include, but are not limited to, nickel (Ni). An annealing process (such as rapid thermal annealing (RTA)) is then performed to react the silicide metal with the (e.g., in-situ n-doped III-V material) in the raised source and drain regions 602. As known in the art, the annealing temperature, duration, etc. and/or amount of silicide metal deposited can be used to control the amount of silicide formed for the contacts 604. Adjusting these silicidation parameters would be within the capabilities of one skilled in the art. A selective (e.g., wet or dry) etching process can then be used to remove the unreacted metal.

As provided above, it may be desirable to maximize the amount by which the halo implant extends beneath the gate stack. It has been found in accordance with the present techniques that increasing the halo dopant concentration underneath the channel region leads to better electrostatic integrity (better threshold voltage roll-off, drain-induced barrier lowering (DIBL), and sub-threshold slope). Now described is an exemplary alternative process flow for forming a MOSFET which may be employed to increase the amount by which the halo implant creeps under the gate stack. The process begins in the same manner as described in conjunction with the description of FIGS. 1 and 2, above.

Thus, by way of reference to FIG. 1, the process flow generally begins by forming a III-V barrier layer 104 on a substrate 102, and then forming a III-V channel layer 106 on the III-V barrier layer 104. STI is then used to form an active area(s) in the III-V channel layer 106 (see STI oxide regions 108). Reference may be made to the description above with regard to suitable substrate, III-V barrier and III-V channel layer, STI, etc. materials and techniques for the formation thereof.

A gate stack 202 is then formed on a side of the III-V channel layer 106 opposite the III-V barrier layer 104. See FIG. 2. According to the exemplary embodiment shown in the figures, the gate stack 202 includes a gate dielectric 204 on the III-V channel layer 106, a metal gate layer 206 on a side of the gate dielectric 204 opposite the III-V channel layer 106, and a semiconductor gate layer 208 on a side of the metal gate layer 206 opposite the gate dielectric 204. Reference may be made to the description above with regard to techniques for the forming the gate stack 202.

By contrast with the example provided above, in this alternative process flow the halo implant is performed first, followed by the source/drain extension implants, spacer formation, etc. Thus reference now shifts to FIG. 7 (which follows from FIG. 2) which (following from FIG. 2) depicts halo implants 702 having been formed in the III-V barrier layer 104 on opposite sides of the gate stack 202. According to an exemplary embodiment, the halo implants 702 may be formed using a higher energy (e.g., in the range of from about 30 KeV to about 50 KeV, and energy ranges therebetween) implant to implant a p-type dopant (such as Zn) into the III-V barrier layer 104 at a tilt angle of about 30 degrees. As is apparent from FIG. 7, by re-ordering the process flow the same tilt angle for the halo implant can enable the halo implants 702 to extend further beneath the gate stack 202. For instance, a comparison of FIG. 5 (first embodiment) with FIG. 7 reveals that the in the instant case the halo implants 702 extend a greater distance beneath the gate stack 202.

Figure 7:
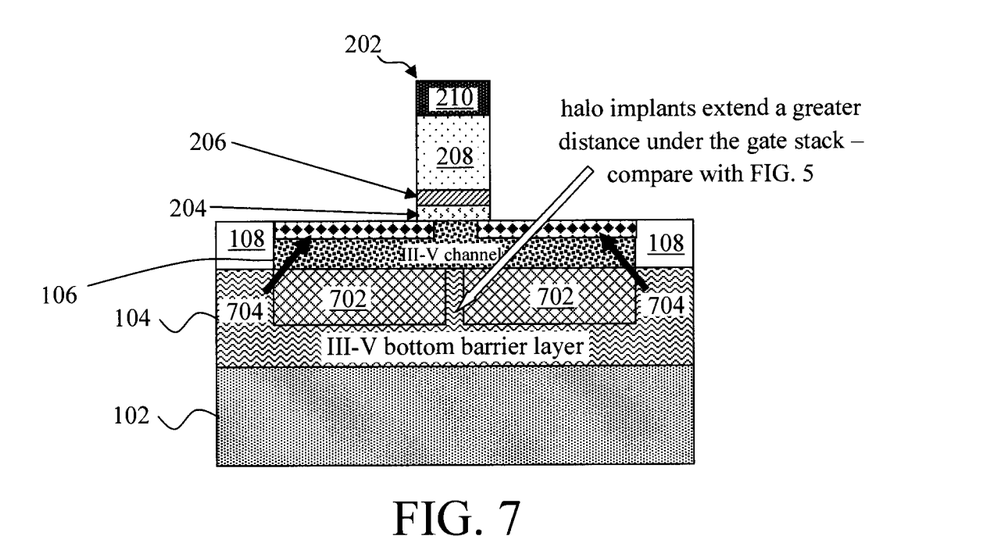
FIG. 7 is a cross-sectional diagram which, following from FIG. 2, illustrates an alternative process flow whereby halo implants are first formed in the III-V barrier layer on opposite sides of the gate stack, followed by source/drain extension implants being formed in the III-V channel layer on opposite sides of the gate stack according to an embodiment of the present invention.

Source/drain extension implants 704 are then formed in the III-V channel layer 106 on opposite sides of the gate stack 202. Standard dopant implantation processes may be employed to form the source/drain extension implants 704. According to an exemplary embodiment, the source/drain extension implants 704 are formed using a low energy implant of an n-type dopant (such as silicon (Si)) into the channel layer 106 at a small tilt angle, e.g., of less than about 10 degrees.

Following the formation of the source/drain extension implants 704, an anneal may be performed to activate (i.e., an activation anneal) the source/drain extension and halo implants. According to an exemplary embodiment, this activation anneal is performed using a RTA process at a temperature of from about 500° C. to about 600° C., and ranges therebetween, e.g., at a temperature of about 550° C.

Figure 8:
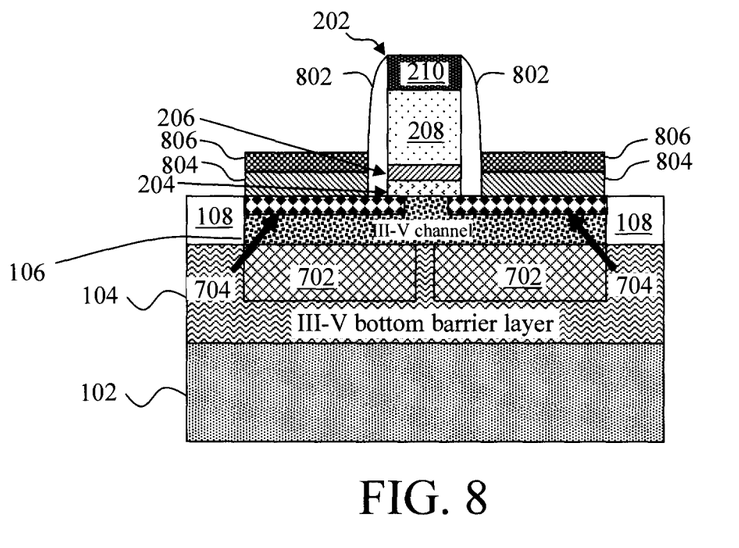
FIG. 8 is a cross-sectional diagram illustrating spacers having been formed on opposite sides of the gate stack, raised source and drain regions having been formed on the III-V channel layer over the source/drain extension implants (on opposite sides of the gate stack), and source and drain contacts having been formed to the raised source and drain regions according to an embodiment of the present invention.

As shown in FIG. 8, spacers 802 may then be formed on opposite sides of the gate stack 202. Spacers 802 serve to offset the gate stack 202 from the source and drain regions (see below). According to an exemplary embodiment, spacers 802 are formed by first blanket depositing a spacer material onto the structure, and then using standard lithography and etching (e.g., RIE) to pattern the spacer material into the individual spacers 802. Suitable spacer materials include, but are not limited to, a nitride spacer material such as SiN.

Raised source and drain regions 804 are formed on the III-V channel layer 106 over the source/drain extension implants 704 (on opposite sides of the gate stack 202). By way of example only, the raised source and drain regions 804 can be formed using an epitaxial growth process. According to an exemplary embodiment, the raised source and drain regions 804 are formed from an in-situ n-doped III-V material such as gallium arsenide, indium gallium arsenide, gallium antimonide, and/or indium arsenide.

Finally, source and drain contacts 806 are formed on each of the raised source and drain regions 804. By way of example only, contacts 806 can be formed using a silicidation process wherein a silicide metal is deposited onto the structure. The silicide metal will only react with exposed semiconductor—making the process self-aligned, i.e., forming a salicide. In the example depicted, the hard mask 210 prevents silicidation of the gate stack 202. Suitable silicide metals include, but are not limited to, Ni. An annealing process (such as RTA) is then performed to react the silicide metal with the (e.g., in-situ n-doped III-V material) in the raised source and drain regions 804. A selective (e.g., wet or dry) etching process can then be used to remove the unreacted metal.

Although illustrative embodiments of the present invention have been described herein, it is to be understood that the invention is not limited to those precise embodiments, and that various other changes and modifications may be made by one skilled in the art without departing from the scope of the invention.

What is claimed is:

1. A method of forming a metal-oxide semiconductor field effect transistor (MOSFET) device, the method comprising the steps of:

forming a III-V barrier layer on a substrate;

forming a III-V channel layer on a side of the III-V barrier layer opposite the substrate, wherein the III-V barrier layer is configured to confine charge carriers in the MOSFET device to the III-V channel layer;

forming a gate stack on a side of the III-V channel layer opposite the III-V barrier layer;

forming halo implants in the III-V barrier layer on opposite sides of the gate stack;

forming source and drain extension implants in the III-V channel layer on the opposite sides of the gate stack; and removing portions of the III-V channel layer and portions of the source and drain extension implants adjacent to the opposite sides of the gate stack thereby exposing underlying portions of the III-V barrier layer on the opposite sides of the gate stack, wherein the step of forming the source and drain extension implants and the step of removing the portions of the III-V channel layer and the portions of the source and drain extension implants are performed before the step of forming the halo implants.

2. The method of claim 1, further comprising the step of:
using shallow trench isolation (STI) to define at least one active area in the III-V channel layer.

3. The method of claim 1, wherein the gate stack comprises a gate dielectric, a gate metal layer on the gate dielectric, and a semiconductor gate layer on a side of the gate metal layer opposite the gate dielectric.

4. The method of claim 1, wherein the III-V barrier layer comprises a first III-V material and the channel layer comprises a second III-V material, and wherein the first III-V material has a wider band gap than the second III-V material.

5. The method of claim 1, wherein the portions of the III-V channel layer and portions of the source and drain extension implants adjacent to opposite sides of the gate stack are removed using an anisotropic etching process wherein the III-V barrier layer acts as an etch stop.

6. The method of claim 1, further comprising the step of:
   forming spacers on opposite sides of the gate stack,
   wherein the step of forming the spacers is performed before the step of removing the portions of the III-V channel layer and the portions of the source and drain extension implants.

7. The method of claim 1, further comprising the steps of:
   forming raised source and drain regions on the III-V barrier layer adjacent to the III-V channel layer on the opposite sides of the gate stack; and
   forming source and drain contacts on each of the raised source and drain regions.

\* \* \* \* \*